United States Patent
Lee et al.

(10) Patent No.: US 8,405,103 B2
(45) Date of Patent: Mar. 26, 2013

(54) PHOTONIC CRYSTAL LIGHT EMITTING DEVICE AND MANUFACTURING METHOD OF THE SAME

(75) Inventors: Dong Yul Lee, Gyunggi-do (KR); Seong Ju Park, Gwangju (KR); Min Ki Kwon, Jeollabuk-do (KR); Ja Yeon Kim, Jeollabuk-do (KR); Yong Chun Kim, Gyunggi-do (KR); Bang Won Oh, Gyunggi-do (KR); Seok Min Hwang, Busan (KR); Je Won Kim, Seoul (KR)

(73) Assignee: Samsung Electronics Co., Ltd., Seoul (KR)

( * ) Notice: Subject to any disclaimer, the term of this patent is extended or adjusted under 35 U.S.C. 154(b) by 89 days.

(21) Appl. No.: 12/182,383

(22) Filed: Jul. 30, 2008

(65) Prior Publication Data

US 2009/0184334 A1    Jul. 23, 2009

(30) Foreign Application Priority Data

Jul. 30, 2007  (KR) .................. 10-2007-0076376

(51) Int. Cl.
*H01L 33/00* (2010.01)
(52) U.S. Cl. ............. 257/98; 257/13; 257/E33.064; 257/E33.067; 438/29
(58) Field of Classification Search .................. None
See application file for complete search history.

(56) References Cited

U.S. PATENT DOCUMENTS

| | | | | |
|---|---|---|---|---|
| 6,420,732 | B1 * | 7/2002 | Kung et al. | 257/79 |
| 2002/0167013 | A1 * | 11/2002 | Iwasaki et al. | 257/79 |
| 2005/0035354 | A1 * | 2/2005 | Lin et al. | 257/79 |
| 2005/0082545 | A1 * | 4/2005 | Wierer et al. | 257/79 |
| 2005/0173717 | A1 * | 8/2005 | Lee et al. | 257/98 |
| 2007/0034857 | A1 | 2/2007 | Song | |
| 2007/0040162 | A1 | 2/2007 | Song | |
| 2007/0257269 | A1 * | 11/2007 | Cho et al. | 257/95 |
| 2008/0061304 | A1 * | 3/2008 | Huang et al. | 257/79 |
| 2008/0149916 | A1 * | 6/2008 | Baba et al. | 257/13 |

FOREIGN PATENT DOCUMENTS

| | | |
|---|---|---|
| JP | 2004-134501 | 4/2004 |
| JP | 2004-253811 | 9/2004 |
| JP | 2006-135311 A | 5/2006 |
| JP | 2006-237574 A | 9/2006 |
| JP | 2007-053383 A | 3/2007 |

OTHER PUBLICATIONS

Japanese Office Action, with English translation thereof, issued in Japanese Patent Application No. 2008-196915, dated Jun. 14, 2011.

\* cited by examiner

*Primary Examiner* — Michelle Mandala
*Assistant Examiner* — Shaka White
(74) *Attorney, Agent, or Firm* — McDermott Will & Emery LLP

(57) ABSTRACT

There is provided a photonic crystal light emitting device including: a light emitting structure including first and second conductivity type semiconductor layers and an active layer interposed therebetween; a transparent electrode layer formed on the second conductivity type semiconductor layer, the transparent electrode layer having a plurality of holes arranged with a predetermined size and period so as to form a photonic band gap for light emitted from the active layer, whereby the transparent electrode layer includes a photonic crystal structure; and first and second electrode electrically connected to the first conductivity type semiconductor layer and the transparent electrode layer, respectively. The photonic crystal light emitting device has a transparent electrode layer formed of a photonic crystal structure defined by minute holes, thereby improved in light extraction efficiency.

6 Claims, 7 Drawing Sheets

PHOTONIC CRYSTAL LIGHT EMITTING DEVICE AND MANUFACTURING METHOD OF THE SAME

CROSS-REFERENCE TO RELATED APPLICATIONS

This application claims the priority of Korean Patent Application No. 2007-0076376 filed on Jul. 30, 2007, in the Korean Intellectual Property Office, the disclosure of which is incorporated herein by reference.

BACKGROUND OF THE INVENTION

1. Field of the Invention

The present invention relates to a photonic crystal light emitting device, and more particularly, to a photonic crystal light emitting device which has a transparent electrode layer formed of a photonic crystal structure defined by minute holes to increase light extraction efficiency, and a method of manufacturing the same.

2. Description of the Related Art

A semiconductor light emitting diode (LED) is a semiconductor device generating light of various colors when a current is supplied due to recombination of electrons and holes at a junction portion of p- and n-type semiconductors. This LED exhibits advantages such as longer useful life, lower power consumption, superior initial driving characteristics and high vibration resistance over a filament-based light emitting device. This has led to a continuous increase in demand. Particularly, of late, a group III nitride semiconductor capable of emitting light at a short wavelength such as blue light has been highlighted.

In such a semiconductor light emitting device, light generated from the active layer is reflected to different degrees according to an incident angle thereof when incident on an interface between air/GaN. Here, theoretically, when the light is incident at an incident angle of at least 26°, the light generated from the active layer is totally internally reflected and the totally internally reflected light is guided outward through sides, or absorbed or attenuated inside to mainly degrade emission efficiency.

Therefore, as one of methods for minimizing these problems and enhancing external light extraction efficiency, microstructures have been formed on a surface where the light exits outside.

As described above, a technology of reducing total reflection through the microstructures may increase external light extraction efficiency to some degree. However, there is required a structure for ensuring better emission efficiency. Particularly, in a case where the microstructures are formed on the p-type semiconductor layer by dry etching, chiefly, induction coupled plasma reactive ion etching (ICP-RIE), a semiconductor crystal structure for electrical operation, particularly a crystal structure near an active layer is severely impaired. Furthermore, at this time, an n-type donor is generated in a p-doped area to reduce a doping concentration of the p-type semiconductor layer. This phenomenon occurs not only locally but spreads longitudinally and horizontally. This accordingly may cause the semiconductor light emitting device to malfunction as an electrical driving device.

SUMMARY OF THE INVENTION

An aspect of the present invention provides a photonic crystal light emitting device which has a transparent electrode layer formed of a photonic crystal structure defined by minute holes to increase light extraction efficiency and a method of manufacturing the same. An aspect of the present invention also provides a method of manufacturing a photonic crystal light emitting device in which a p-type semiconductor layer suffers minimal damage resulting from etching to enhance electrical and optical properties of the device.

According to an aspect of the present invention, there is provided a photonic crystal light emitting device including: a light emitting structure including first and second conductivity type semiconductor layers and an active layer interposed therebetween; a transparent electrode layer formed on the second conductivity type semiconductor layer, the transparent electrode layer having a plurality of holes arranged with a predetermined size and period so as to form a photonic band gap for light emitted from the active layer, whereby the transparent electrode layer includes a photonic crystal structure; and first and second electrode electrically connected to the first conductivity type semiconductor layer and the transparent electrode layer, respectively.

The transparent electrode layer may be formed of a metal oxide.

The transparent electrode layer may be formed of a material selected from a group consisting of ITO, $In_2O_3$, $SnO_2$, MgO, $Ga_2O_3$, ZnO and $Al_2O_3$.

The holes may be filled with a material having refractivity different from refractivity of a material for the transparent electrode layer.

The material filled in the holes may be $SiO_2$.

The holes each may be shaped as one of a circle, a square and a hexagon.

The second electrode may be formed on a top of the transparent electrode layer, and the photonic crystal structure of the transparent electrode layer may be formed in an area of the transparent electrode layer excluding a portion where the second electrode is formed.

The first and second conductivity type semiconductor layers may be n-type and p-type semiconductor layers, respectively.

The first conductivity type semiconductor layer, the active layer and the second conductivity type layer may be formed of a nitride.

According to another aspect of the present invention, there is provided a method of manufacturing a photonic crystal light emitting device, the method including: forming a first conductivity type semiconductor layer, an active layer and a second conductivity type semiconductor layer sequentially on a substrate; forming photoresist patterns on the second conductivity type semiconductor layer; forming a transparent electrode layer on a portion of the second conductivity type semiconductor layer where the photo resist patterns are not formed; removing the photo resist patterns; and forming first and second electrodes to electrically connect to the first conductivity type semiconductor layer and the transparent electrode layer, respectively, wherein portions of the second conductivity type semiconductor layer where the photo resist patterns are removed are arranged with a predetermined size and period so as to form a photonic band gap for light emitted from the active layer, thereby defining a photonic crystal structure together with the transparent electrode layer.

According to still another aspect of the present invention, there is provided a method of manufacturing a photonic crystal light emitting device, the method including: forming a first conductivity type semiconductor layer, an active layer and a second conductivity type semiconductor layer sequentially on a substrate; forming a photonic crystal structure layer on the second conductivity type semiconductor layer; forming photo resist patterns on the photonic crystal structure layer;

forming photonic crystal patterns by removing a portion of the photonic crystal structure layer where the photo resist patterns are not formed; forming a transparent electrode layer on the removed portion of the photonic crystal structure layer; removing the photo resist patterns; and forming first and second electrodes to electrically connect to the first conductivity type semiconductor layer and the transparent electrode layer, respectively, wherein the photonic crystal patterns are arranged with a predetermined size and period so as to form a photonic band gap for light emitted from the active layer, thereby defining a photonic crystal structure together with the transparent electrode layer.

The photonic crystal structure layer may be formed of a material having refractivity different from refractivity of a material for the transparent electrode layer.

The photonic crystal structure layer may be formed of $SiO_2$.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
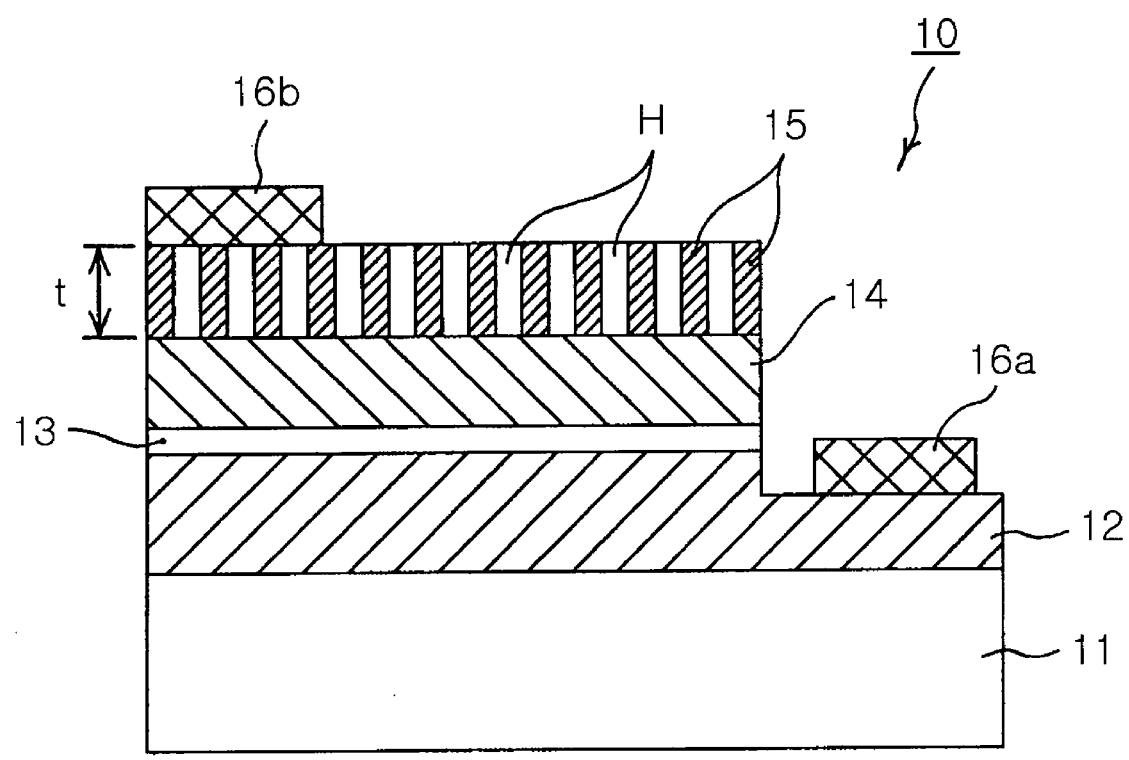
FIG. 1 is a cross-sectional view illustrating a photonic crystal light emitting device according to an exemplary embodiment of the invention.

Exemplary embodiments of the present invention will now be described in detail with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference signs are used to designate the same or similar components throughout.

FIG. 1 is a cross-sectional view illustrating a photonic crystal light emitting device according to an exemplary embodiment of the invention.

Referring to FIG. 1, the photonic crystal light emitting device 10 of the present embodiment includes a sapphire substrate 11, an n-type semiconductor layer 12, an active layer 13, a p-type semiconductor layer 14, a transparent electrode layer 15, and n- and p-electrodes 16a and 16b.

The sapphire substrate 11 serves as a substrate for growing a semiconductor single crystal. The sapphire substrate 11 is a Hexa-Rhombo crystal. The sapphire substrate 11 has a lattice constant of 13.001 Å in c-axis orientation, and a lattice constant of 4.765 Å in a-axis orientation. A C-plane of this sapphire substrate 11 ensures a nitride film to be grown thereon relatively easily, and is stable even at a high temperature, thus predominantly utilized as a substrate for nitride growth. The substrate for growing a semiconductor single crystal applicable to the present embodiment is not limited to the sapphire substrate 11. Alternatively, a substrate generally used for single crystal growth, for example, a substrate formed of SiC, MgAl2O4, MgO, LiAlO2 or LiGaO2 may be employed.

The n-type and p-type semiconductor layers 12 and 14 and the active layer of the light emitting structure will be described. First, the n-type and p-type semiconductor layers 12 and 14 may be formed of a nitride semiconductor. In the specification, a "nitride semiconductor" denotes a binary, ternary or quaternary compound semiconductor represented by AlxInyGa(1-x-y)N, where $0 \leqq x \leqq 1$, $0 \leqq y \leqq 1$, and $0 \leqq x+y \leqq 1$.

That is, the n-type and p-type semiconductor layers 12 and 14 may be formed of an n-doped or p-doped semiconductor material having a composition expressed by AlxInyGa(1-x-y)N, where $0 \leqq x \leqq 1$, $0 \leqq y \leqq 1$, and $0 \leqq x+y \leqq 1$. Representative examples of such a semiconductor material include GaN, AlGaN, and InGaN. Also, Si, Ge, Se, Te or C may be utilized as the n-dopant and Mg, Zn or Be may be utilized as a p-dopant.

The active layer 13 is formed of an undoped nitride semiconductor layer having a single or multiple well structure, and emits light with a predetermined energy due to recombination of electrons and holes.

Meanwhile, the n-type and p-type semiconductor layers 12 and 14 and the active layer 13 may be grown by a process of growing a semiconductor single crystal, particularly, metal-organic chemical vapor deposition (MOCVD), molecular beam epitaxy (MBE) or hydride vapor phase epitaxy (HVPE), which are known as a process for growing a nitride single crystal.

The transparent electrode layer 15 is formed on an exiting path of the light emitted from the active layer 13, i.e., a top surface of the p-type semiconductor layer 14. The transparent electrode layer 15 is formed of a photonic crystal structure to enhance light extraction efficiency.

Here, the photonic crystal structure is configured such that periodic lattice structures with different refractivities are fabricated to control transmission and generation of electromagnetic waves. In the periodic lattice structure with different refractivities, there exists a specific wavelength bandwidth where a propagation mode is not present due to effects of photonic crystals. A region where the propagation mode is not present is referred to as an electromagnetic band gap or a photonic band gap in a similar manner to an energy region where an electronic state cannot be present. The structure with such a band gap is termed a photonic crystal. Here, the photon crystal whose period is similarly sized to a wavelength of the light has a photonic band gap structure.

This photonic crystal structure enables control of light propagation and spontaneous emission as well, thereby enhancing performance of the photonic device and reducing size thereof.

That is, when the photon crystal is formed such that photons with a predetermined energy exist within the photonic band gap, the photons are prevented from being propagated sideward. This allows substantially all photons to be emitted outside the device, thereby increasing light extraction efficiency.

In the present embodiment, the transparent electrode layer 15 has a plurality of holes H arranged two-dimensionally with a predetermined size and period to obtain a photonic crystal structure.

Meanwhile, in view of this photonic crystal structure, and ohmic contact function between the electrode 16b and the p-type semiconductor layer 14, the transparent electrode layer 15 may be formed of a metal oxide. For example, the transparent electrode layer 15 may be formed of one of ITO, In2O3, SnO2, MgO, Ga2O3, ZnO, and Al2O3.

In addition, in the present embodiment, each of the holes H formed in the transparent electrode layer 15 is not filled with a specific material, i.e., air-filled.

Figure 2A:
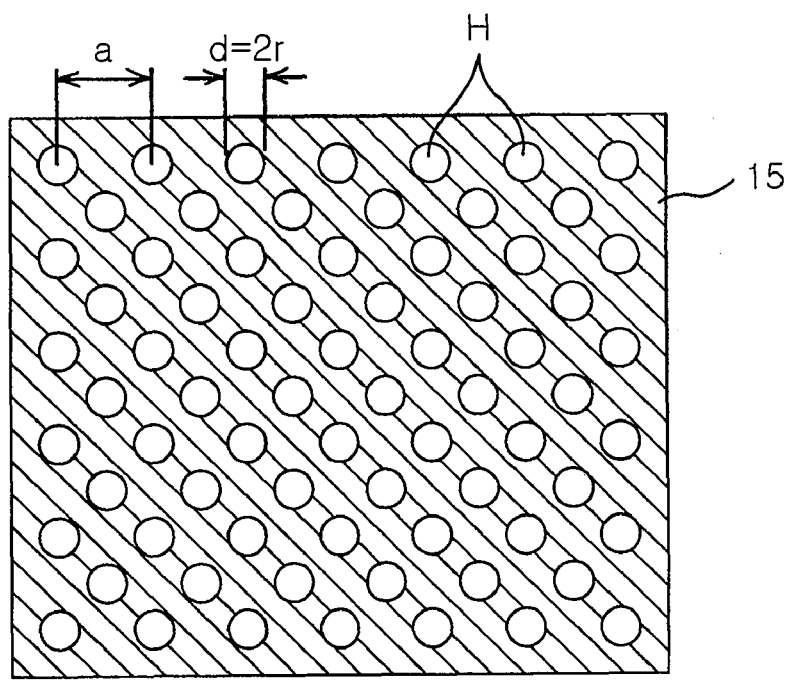
FIG. 2A is a more detailed plan view illustrating a transparent electrode layer having holes.
Figure 2B:
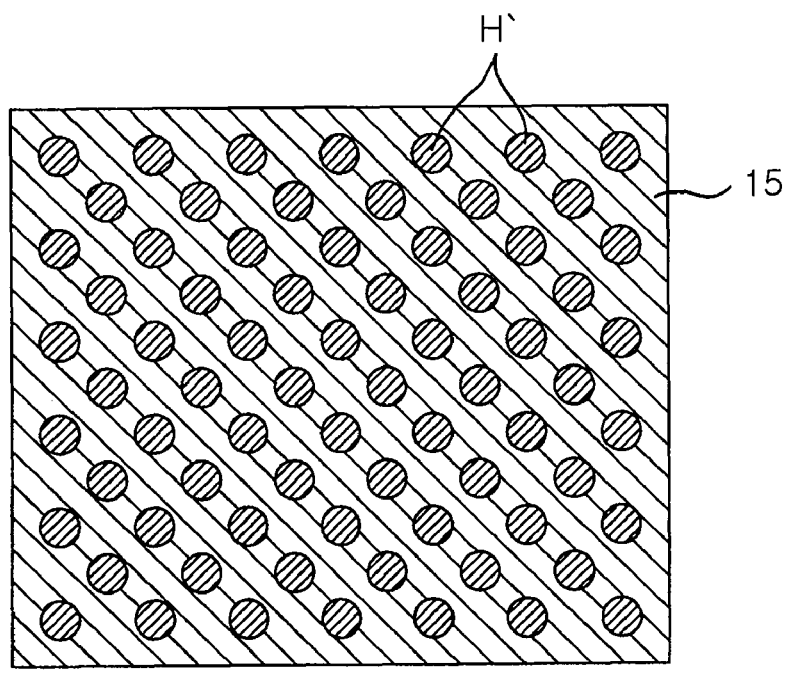
FIG. 2B is a plan view illustrating a transparent electrode layer according to a modified example of FIG. 1.

However, in other embodiments, the hole H may be filled with a predetermined material (see FIG. 2B). Here, the material filled in the hole H may have refractivity different from refractivity of a material for the transparent electrode layer 15. As described above, given that the transparent electrode layer 15 is formed of a metal oxide material, the hole H may be filled with SiO2.

Also, the transparent electrode layer 15 may have a thickness ranging from hundreds of nm to several μm. Therefore, forming the transparent electrode layer 15 as a photonic crystal structure is more advantageous than forming the p-type semiconductor layer as a photonic crystal structure. That is, the photonic crystal structure can be adjusted in thickness in a broader range.

To form the transparent electrode layer 15 as the photonic crystal structure, the holes H are arranged by adjusting the size and period thereof. Particularly, the holes H are arranged with a predetermined size and period so as to form a photonic band gap for the light emitted from the active layer 13. This allows the transparent electrode layer 15 to be formed of a photonic crystal structure.

FIG. 2A is a more detailed plan view illustrating the transparent electrode layer including holes shown in FIG. 2A.

Referring to FIG. 2A, the holes H are formed through the transparent electrode layer 15 with a period a to define the photonic crystal structure. Each of the holes has a size, i.e., radius corresponding to r (diameter d). Here, to define the photonic crystal structure, the period a is substantially identical to a wavelength λ of the emitted light. The period a, wavelength λ and radius r of the hole affect formation of the photonic band gap. This will be explained in further detail with reference to FIG. 4. In view of the wavelength of the light emitted from the active layer, the hole H generally may have a radius r ranging from several to hundreds of nanometers.

As described above, the hole may be filled with a material such as SiO2, not air, as shown in FIG. 2B. That is, in the embodiment of FIG. 2B, the photonic crystal structure of the transparent electrode layer 15 is a structure H' in which the hole of FIG. 2A is filled with a material such as SiO2. Here, in place of SiO2, the hole may be filled with a material having refractivity different from refractivity of the material for the transparent electrode layer 15. For example, other oxide, an inorganic material or an organic material may be filled in the hole.

Figure 3A:
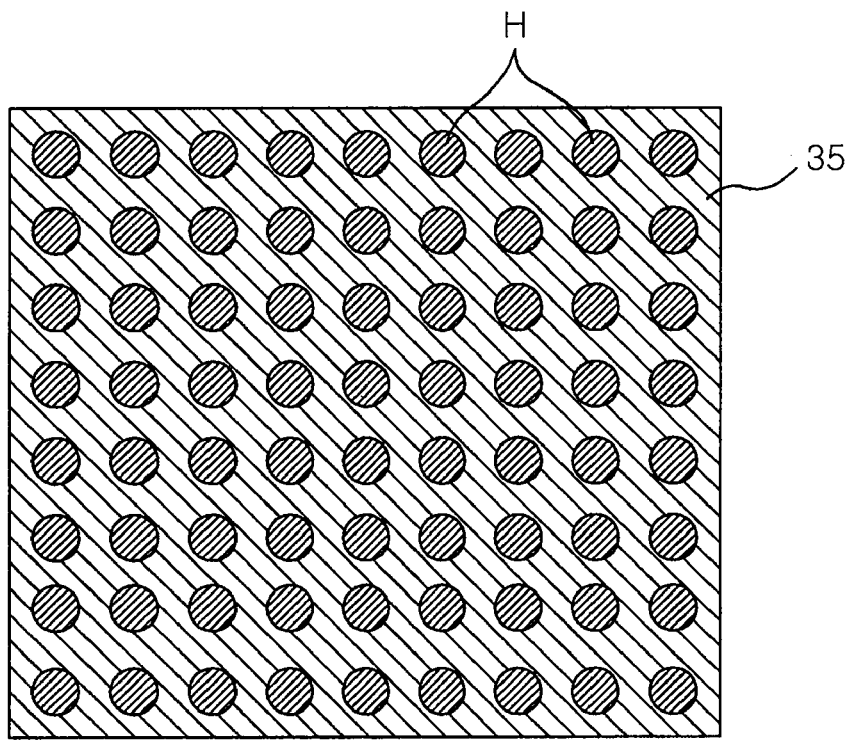
FIG. 3A is a plan view illustrating a transparent electrode layer according to another modified example of FIG. 1.

Referring to FIGS. 2A and 2B, the holes H are arranged such that a first row and a second row are staggered with respect to each other. In addition to this arrangement, in other embodiments, as shown in FIG. 3, each hole H (SiO2 filled in the present embodiment) may be formed through the transparent electrode layer 35 such that rows and columns are aligned with respect to one another, respectively to define a photonic crystal structure.

Figure 3B:
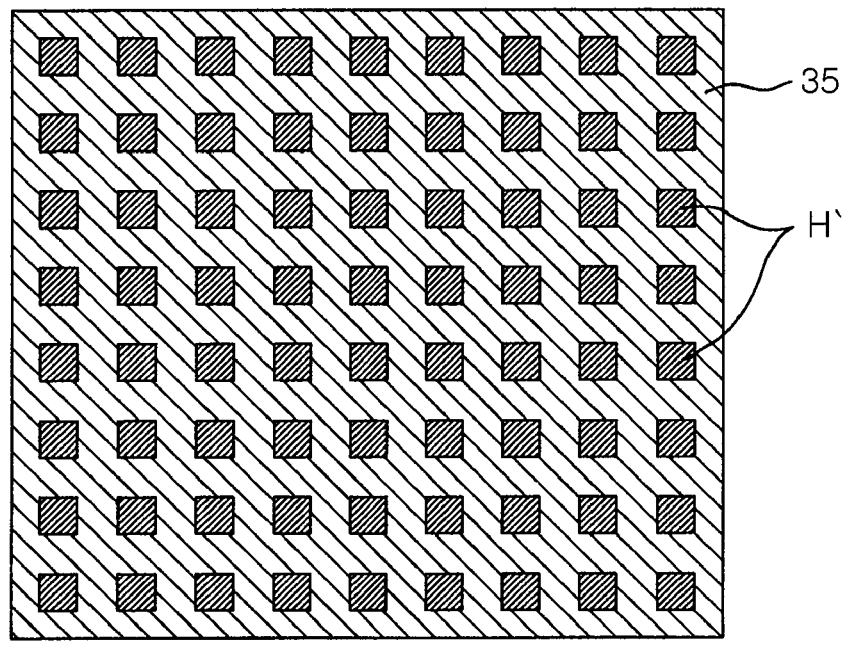
FIG. 3B is a plan view illustrating a transparent electrode layer according to still another modified example of FIG. 1.

Also, the hole may be shaped as not only a generally applicable circle but also a polygon such as a square or hexagon. As just described, the hole may have a shape varied to adjust a photonic band gap such as transverse magnetic (TM) mode and transverse electric (TE) mode as describe later. Accordingly, this maximizes light extraction efficiency. Referring to FIG. 3B, which is slightly modified from FIG. 3A, the hole H' perforated through the transparent electrode layer 35' may be shaped as a square and filled with SiO2 as described above.

In the present embodiment, a relationship among the period a and radius r of the hole and the wavelength λ of light emitted from the active layer and incident on the transparent electrode layer is a significantly influential factor in forming the photonic band gap. This will be described with reference to FIG. 4.

Figure 4:
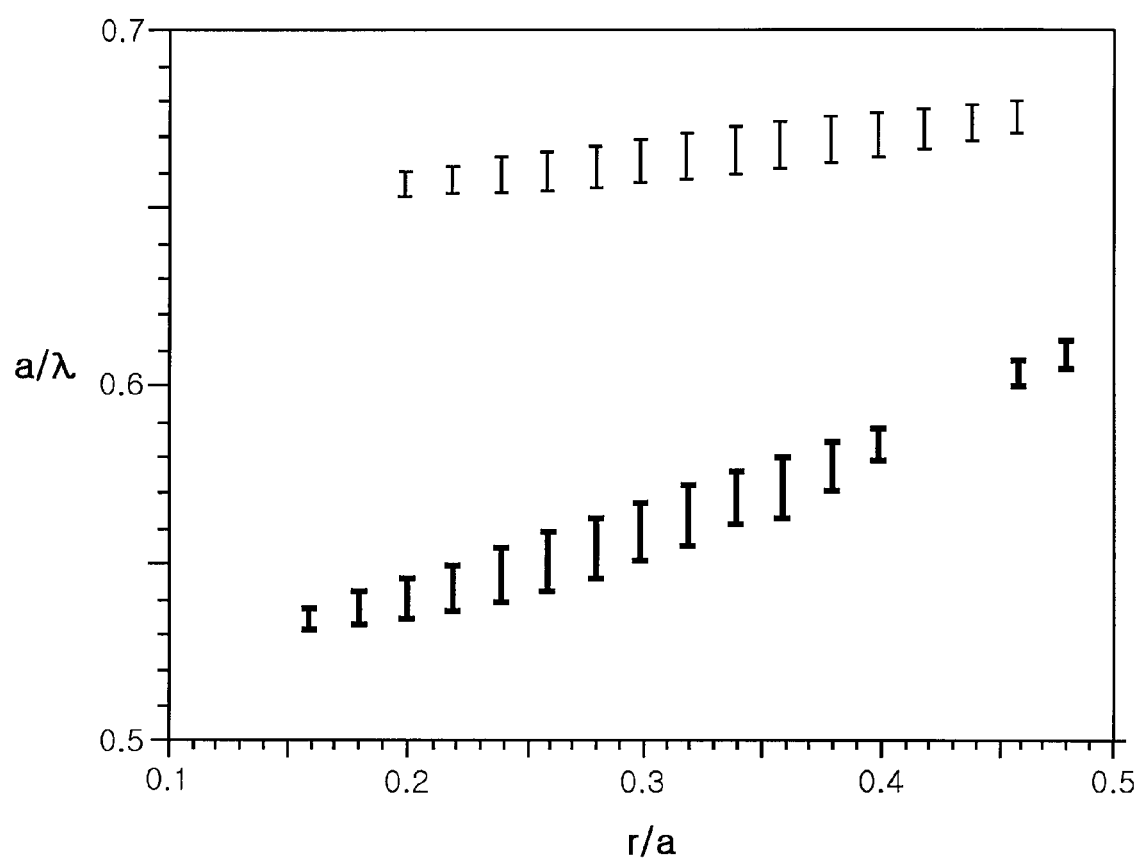
FIG. 4 is a graph illustrating a photonic band gap for forming a photonic crystal structure, in which the photonic band gap is simulated according to a radius r/period a value and a period a/wavelength λ value.

FIG. 4 is a graph illustrating a photonic band gap for forming a photonic crystal structure, in which a photonic band gap is simulated according to a radius(r)/period(a) value and a period(a)/wavelength(λ) value.

Referring to FIG. 4, relatively thick lines denote a photonic band gap formed by a TE mode and thin lines denote a photonic band gap formed by a TM mode of the light. As described above, when the photonic crystal structure is formed such that photons having a predetermined energy exist within a photonic band gap, the photons are prevented from spreading sideward. This allows substantially all photons to be emitted outward. That is, when the photons have an energy belonging to the photonic band gap shown in FIG. 4, external light extraction efficiency can be improved.

Therefore, the period a and radius r of the hole and the wavelength λ of the light can be adjusted in view of simulation results of FIG. 4 to form the photonic crystal structure. Here, the wavelength λ generally may be determined by characteristics of the light emitting device itself, and thus the period a and radius r of the hole may be adjusted accordingly. In the present embodiment, the wavelength λ is set to 450 nm.

Meanwhile, the n- and p-electrodes 16a and 16b serve as an electrode layer for electrical connection of the device. At this time, the n-electrode and p-electrode 16a and 16b are typically formed of an alloy containing Au. These n-electrode and p-electrode 16a and 16b may be formed by deposition or sputtering, which is a general method for growing a metal layer.

Figure 5:
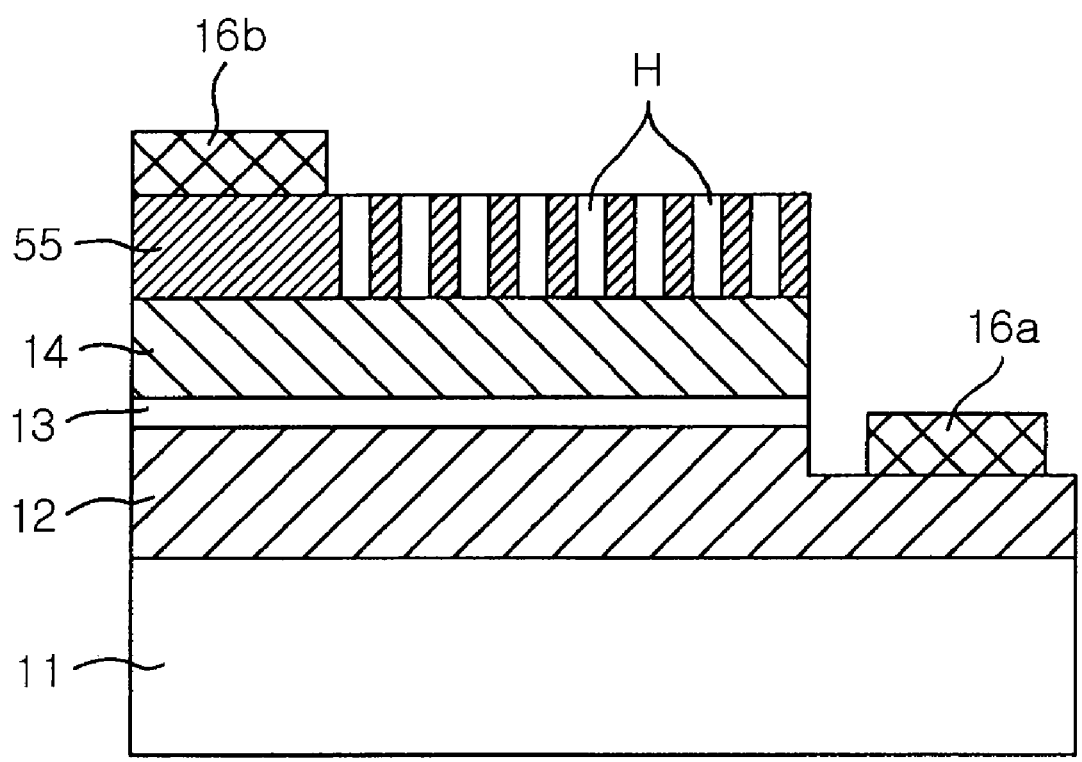
FIG. 5 is a cross-sectional view illustrating a photonic crystal light emitting device according to another exemplary embodiment of the invention.

FIG. 5 is a cross-sectional view illustrating a photonic crystal light emitting device according to another exemplary embodiment of the invention.

The photonic crystal light emitting device of the present embodiment is a slightly modified example of FIG. 1. In this embodiment, the photonic crystal structure is formed in an area of the transparent electrode layer 55 excluding a portion where the p-electrode 16b is formed. Thus, in this structure, the portion of the transparent electrode layer 15 in contact with the p-electrode 16b is formed flat to ensure an efficient supply of current. Other than this difference, the same reference numerals are construed to denote the same components as in the previous embodiment.

Hereinafter, with reference to FIGS. 6 and 7, a method of manufacturing a photonic crystal light emitting device will be described. Here, as described above, a semiconductor single crystal or an electrode layer can be formed on a substrate by a known art. Thus, hereinafter, a process of forming the transparent electrode layer as a photonic crystal structure will be described.

FIGS. 6A to 6C and 7A to 7E are cross-sectional views illustrating a process of forming a photonic crystal structure in a method of manufacturing a photonic crystal light emitting device according to an exemplary embodiment of the invention.

Figure 6A:
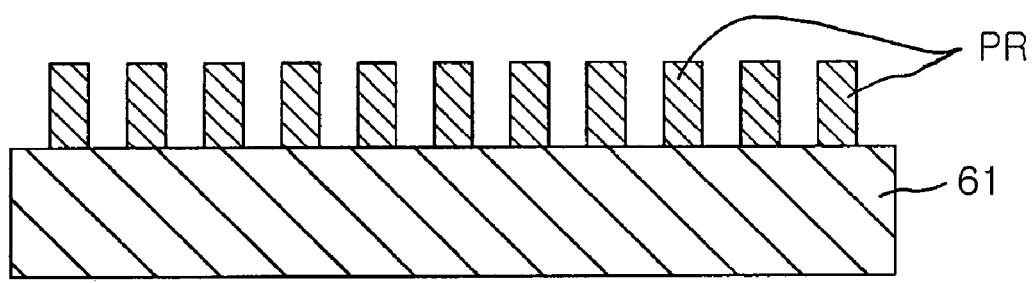
FIGS. 6A to 6C is a cross-sectional view illustrating a process of forming a photonic crystal structure in a method of manufacturing a light emitting device according to an exemplary embodiment of the invention.
Figure 6B:
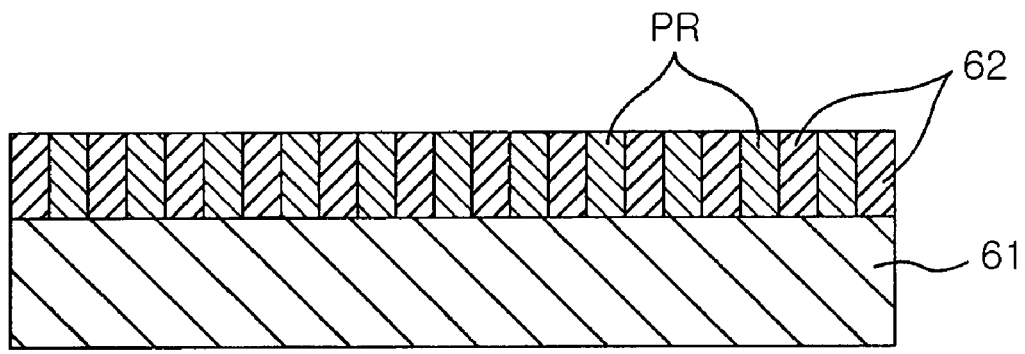
Figure 6C:
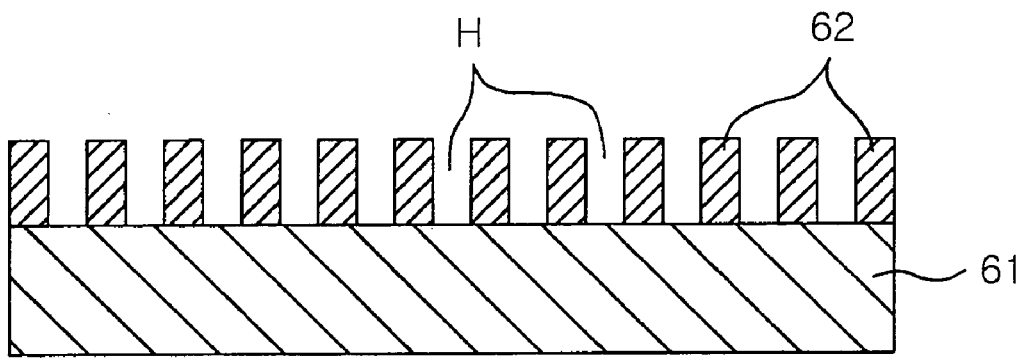

When it comes to a manufacturing method of FIGS. 6A to 6C, first, as shown in FIG. 6A, photoresist patterns PR are formed on a light emitting structure 61. Here, the light emitting structure 61 is construed to include a substrate, n-type and p-type semiconductor layers and an active layer shown in FIG. 1. The light emitting structure 61 is formed as described above.

The photoresist patterns PR are formed on a top surface of the p-type semiconductor layer. The photoresist patterns PR are for forming holes. That is, after the photoresist patterns PR are removed, holes H are formed corresponding to the removed photoresist patterns. The photoresist patterns PR are patterned by considering the radius or period of the holes H. Here, a factor to be considered is that as described above, the holes H should be arranged with a predetermined size and period so as to form a photonic band gap for light emitted from the active layer.

Thereafter, as shown in FIG. 6B, a metal oxide layer 62 serving as a transparent electrode layer is formed between the photoresist patterns PR. Specifically, a metal oxide layer 62 made of e.g., ITO is formed by deposition or anodization. The metal oxide layer 62 corresponds to a transparent electrode layer described in the previous embodiment. After removal of the photoresist patterns PR, the holes H formed in correspondence therewith define a photonic crystal structure.

FIG. 6C illustrates the photonic crystal structure of the transparent electrode layer 62 completed by removing the photoresist patterns PR. The photoresist patterns PR are removed by a known process such as ashing and stripping.

The transparent electrode layer 62 formed by such a process is identical to the one shown in FIG. 1. Hereinafter, a process of forming the photonic crystal structure according to another exemplary embodiment of the invention will be described.

Figure 7A:
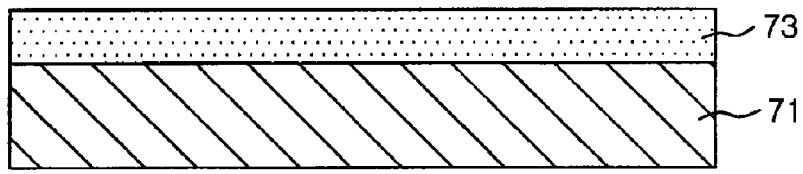
FIGS. 7A to 7E is a cross-sectional view illustrating a process of forming a photonic crystal structure in a method of manufacturing a light emitting device according to another exemplary embodiment of the invention.

First, as shown in FIG. 7A, a SiO2 layer 73 is formed on a light emitting structure 71. The SiO2 layer 73 is formed to fill the holes H of FIG. 6. The photonic crystal structure completed in this fashion is illustrated in FIG. 2B. Also, as described above, the SiO2 layer 73 may be formed of other material, for example, other oxide, an inorganic material or an organic material.

Figure 7B:
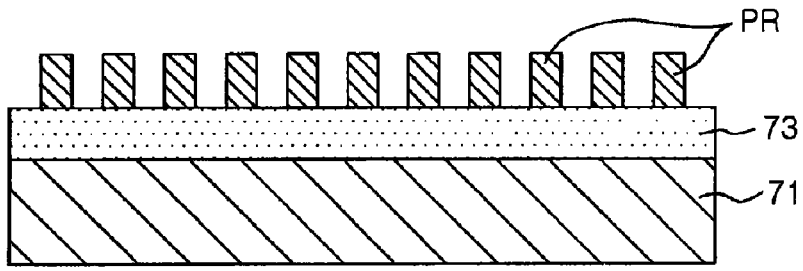
Figure 7C:
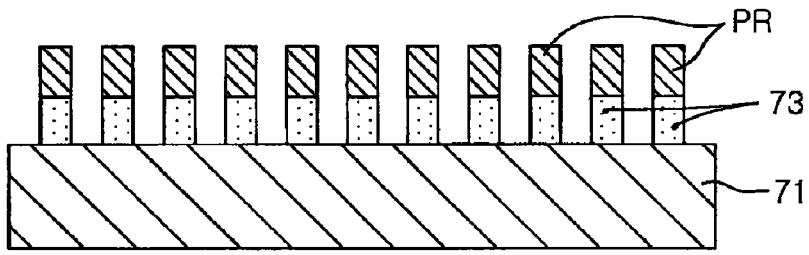

Afterwards, as shown in FIG. 7B, photoresist patterns PR are formed on the SiO2 layer 73. Then, as shown in FIG. 7C, an exposed portion of the SiO2 layer 73 where the photoresist patterns PR are not formed is partially etched. The etched portion partially exposes the light emitting structure 71. The exposed portion serves as an area for forming a metal oxide layer.

Figure 7D:
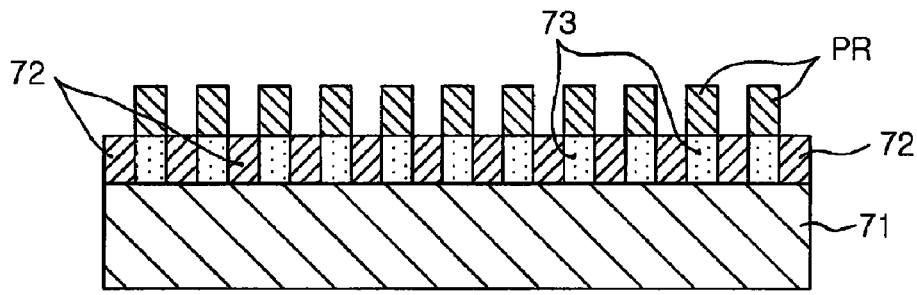
Figure 7E:
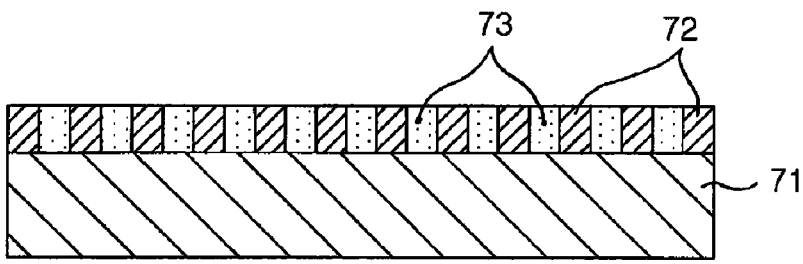

Next, as shown in FIG. 7D, a metal oxide layer 72 is formed between the photoresist patterns PR. Specifically, the metal oxide layer 72 made of e.g., ITO is formed by deposition or anodization. The metal oxide layer 72 corresponds to the transparent electrode layer described in the previous embodiment. After removal of the photoresist patterns PR, the metal oxide layer 72 has a photonic crystal structure defined by the SiO2 layer 73.

Finally, the photoresist patterns PR are removed to complete the photonic crystal structure of the transparent electrode layer 72. As described above, the photoresist patterns PR may be removed by a known process such as ashing or stripping.

As set forth above, according to exemplary embodiments of the invention, a transparent electrode layer is formed of a photonic crystal structure defined by minute holes to obtain a photonic crystal light emitting device improved in light extraction efficiency.

Furthermore, the photonic crystal structure is formed in not a p-type semiconductor layer but a transparent electrode layer. This ensures the p-type semiconductor layer to suffer minimum damage resulting from etching to enhance electrical and optical properties of a device.

While the present invention has been shown and described in connection with the exemplary embodiments, it will be apparent to those skilled in the art that modifications and variations can be made without departing from the spirit and scope of the invention as defined by the appended claims.

What is claimed is:

1. A photonic crystal light emitting device comprising:
a light emitting structure including first and second conductivity type semiconductor layers and an active layer interposed therebetween;
a transparent electrode layer disposed on the second conductivity type semiconductor layer, the transparent electrode layer having a plurality of holes formed therein, arranged with a predetermined size and period so as to form a photonic band gap for light emitted from the active layer, whereby the transparent electrode layer comprises a photonic crystal structure; and
first and second electrodes electrically connected to the first conductivity type semiconductor layer and the transparent electrode layer, respectively, wherein:
the photonic crystal structure is formed only in the transparent electrode layer,
the plurality of holes are formed completely through from a first surface to a second surface of the transparent electrode layer,
the transparent electrode layer is formed of a material selected from a group consisting of indium tin oxide (ITO), Indium(III) oxide ($In_2O_3$), Tin dioxide ($SnO_2$), Magnesium oxide (MgO), Gallium(III) oxide ($Ga_2O_3$), Zinc oxide (ZnO) and Aluminium oxide ($Al_2O_3$),
the holes are filled with Silicon Oxide ($SiO_2$) having a refractivity different from a refractivity of the material of the transparent electrode layer,
the second electrode is made of a metal,
the second electrode is disposed on a surface of the transparent electrode layer, such that the second electrode covers only a portion of all of the holes, and
the transparent electrode layer is configured to form the photonic band gap for a transverse magnetic (TM) mode, such that the ratio of the radius of each hole to the predetermined period of the holes ranges between 0.2 and 0.5 and the ratio of the predetermined period to the wavelength of the emitted light ranges between 0.65 and 0.7.

2. The photonic crystal light emitting device of claim 1, wherein the transparent electrode layer is formed of a metal oxide.

3. The photonic crystal light emitting device of claim 1, wherein the holes each are shaped as one of a circle, a square and a hexagon.

4. The photonic crystal light emitting device of claim 1, wherein the second electrode is formed on a top of the transparent electrode layer.

5. The photonic crystal light emitting device of claim 1, wherein the first and second conductivity type semiconductor layers are n-type and p-type semiconductor layers, respectively.

6. The photonic crystal light emitting device of claim 1, wherein the first conductivity type semiconductor layer, the active layer and the second conductivity type layer are formed of a nitride.

* * * * *